(12) United States Patent
Jacobson et al.

(10) Patent No.: US 7,108,386 B2
(45) Date of Patent: Sep. 19, 2006

(54) HIGH-BRIGHTNESS LED-PHOSPHOR COUPLING

(75) Inventors: Benjamin A. Jacobson, Chicago, IL (US); Robert D. Gengelbach, Rochester, NY (US)

(73) Assignee: Illumitech Inc., Chicago, IL (US)

( * ) Notice: Subject to any disclaimer, the term of this patent is extended or adjusted under 35 U.S.C. 154(b) by 89 days.

(21) Appl. No.: 10/844,153

(22) Filed: May 12, 2004

(65) Prior Publication Data

US 2004/0228115 A1    Nov. 18, 2004

Related U.S. Application Data

(60) Provisional application No. 60/469,649, filed on May 12, 2003.

(51) Int. Cl.
*F21V 9/16* (2006.01)
(52) U.S. Cl. .............. 362/84; 362/293; 362/800; 257/99
(58) Field of Classification Search ............ 362/326, 362/84, 293, 800; 313/501, 502, 504, 512, 313/113; 257/79, 99, 100; 353/98, 122
See application file for complete search history.

(56) References Cited

U.S. PATENT DOCUMENTS

| | | | |
|---|---|---|---|
| 3,923,381 A | 12/1975 | Winston | |
| 4,114,592 A | 9/1978 | Winston | |
| 4,152,624 A | 5/1979 | Knaebel | |
| 5,146,248 A * | 9/1992 | Duwaer et al. | 353/122 |
| 5,813,753 A | 9/1998 | Vriens et al. | |
| 5,959,316 A | 9/1999 | Lowery | |
| 5,998,925 A | 12/1999 | Shimizu et al. | |
| 6,319,425 B1 * | 11/2001 | Tasaki et al. | 252/301.36 |
| 6,340,824 B1 | 1/2002 | Komoto et al. | |
| 6,472,765 B1 * | 10/2002 | Sano et al. | 257/787 |
| 6,527,419 B1 | 3/2003 | Galli | |
| 6,635,363 B1 | 10/2003 | Duclos et al. | |
| 6,635,987 B1 | 10/2003 | Wojnarowski et al. | |
| 6,642,652 B1 | 11/2003 | Collins, III et al. | |
| 2002/0084748 A1 * | 7/2002 | Ayala et al. | 313/512 |
| 2003/0008431 A1 * | 1/2003 | Matsubara et al. | 438/98 |
| 2003/0030060 A1 * | 2/2003 | Okazaki | 257/79 |

* cited by examiner

*Primary Examiner*—Renee Luebke
*Assistant Examiner*—Gunyoung T. Lee
(74) *Attorney, Agent, or Firm*—Foley & Lardner LLP

(57) ABSTRACT

A high brightness LED phosphor coupling device. A semiconductor light source is encapsulated by a medium of first index of refraction, a layer of phosphor surrounded by a second medium of second index of refraction of optical index less than the first index and a light coupler for redirecting most of the light from the light source to an area of the phosphor about equal to the area of the light source multiplied by the square of the ratio of the first to the second index of refraction.

14 Claims, 4 Drawing Sheets

HIGH-BRIGHTNESS LED-PHOSPHOR COUPLING

This application claims priority to U.S. Provisional Patent Application No. 60/469,649, filed on May 12, 2003, and incorporated herein by reference.

This invention is directed to a high brightness LED-phosphor coupling device. More particularly the invention is directed to a semiconductor light source encapsulated by a medium of first index of refraction, a layer of phosphor surrounded by a second medium of second optical index less than the first index and a light coupler for redirecting most of the light from the light source to an area of the phosphor about equal to the area of the light source multiplied by the square of the ratio of the first to the second index of refraction.

BACKGROUND AND PRIOR ART

Light-emitting diodes (LEDs) are a commonly used light source in applications including lighting, signaling, signage, and displays. LEDs have several advantages over incandescent and fluorescent lamps, including high reliability, long lifetime, and high efficiency. A typical prior art LED package is shown in FIG. 1. The die is a piece of semiconductor material that actually produces the emitted light. The contact and bond wire carry electrical current to the die. The substrate provides a physical mounting surface for the die and helps conduct away the heat generated by the die. The substrate shown in FIG. 1 is cup-shaped, which helps collect light from the die and redirect it upwards. In some preferred cases, including the example in FIG. 1, the substrate also conducts electrical current. The die is surrounded by an encapsulant, typically a polymer but can be other materials such as glass, which is transparent to the light wavelengths of interest. The encapsulant protects the die from mechanical damage, moisture, and atmospheric exposure. It also increases light extraction efficiency from the die relative to a die in air. The semiconductor die is typically a high-optical-index material such as sapphire, SiC, or GaP. Light inside the high-index material can only escape when it is incident on the die surface at an angle of incidence $\theta<\theta_C=\arcsin[n_{surround}/n_{die}]$, where $n_{surround}$ and $n_{die}$ are the indices of refraction of the surround and die. Light extraction efficiency is improved when this critical angle is as large as possible. Encapsulants have a higher index than air, and therefore they increase light extraction. The encapsulant is generally chosen to have as high an index as possible, but selection is typically constrained by other requirements such as transparency, resistance to thermal and photochemical degradation, hardness, and ease of application and curing in a manufacturing process.

The semiconductor die in an LED typically produces only a narrow spectrum of light, which is perceived by the eye as a single color such as red, blue, green, amber, etc. However, for many applications, especially lighting, broadband white light is preferred. A common approach to providing white light with LEDs is to overlay the die with a phosphor which absorbs some or all of the LED light and emits light at lower wavelengths, thus providing a mixture of colors that the eye perceives as white. This combination of LED phosphor is commonly referred to as a "white LED." White LEDs can be made from a number of LED-phosphor combinations, including blue LED+yellow phospor, blue LED+a combination of red and green phosphors, and UV LED+a combination of red, green, and blue phosphors. The various approaches and difficulties of different materials combinations are well known in the art, such as described by Regina Mueller-Mach et al. in "High-Power Phosphor-Converted Light-Emitting Diodes Based on III-Nitrides," *IEEE Journal On Selected Topics In Quantum Electronics*, Vol. 8, No. 2, March/April 2002.

Performance and reliability of white LEDs also depend on the method for applying the phosphor as well as the materials. The phosphor typically comes in the form of fine powder. The most commonly used method is to disperse this powder in a polymer binder and dispense the mixture directly onto the LED. The polymer binder can be the same material used for the encapsulant, and in fact the phosphor-binder mixture becomes functionally part of the encapsulant. FIGS. 2A and 2B show two examples. In previously developed white LEDs, as shown in FIG. 2A, the phosphor-containing volume was usually much larger than the die, which in turn caused the effective light source area to be much larger than the die. It is well-known in the art of optical design that in a high-collection optical systems the output beam has an etendue $E_{out}=n_{out}^2 A_{out}\Omega_{out}$, where $n_{out}$ is the index of the medium in which the beam emerges (typically air, with n≅1), $A_{out}$ is the area of the beam, and $\Omega_{out}$ is the solid angle of the beam. For high collection efficiency, it is accepted that $E_{out}$ must be greater than or equal to the etendue of the light source itself. The phosphor layer is substantially Lambertian ±90°, which means that the etendue of the phosphor layer is approximately $n_{binder}^2 \times A_{phosphor} \times \pi$ where $n_{binder}$ is the optical index of the medium in which the phosphor is immersed. Since $n_{binder}$ is typically equal to or at least similar to $n_{encapsulant}$, and $A_{phosphor}$ is larger than the area of the die, the etendue of the phosphor layer is clearly much larger than the etendue of the light emerging from the surface of the die into the encapsulant. This larger light source is unfavorable for many applications, especially those requiring that the light be collected and redirected into a highly collimated beam of light within a limited output aperture, for example flashlights, spotlights, and automotive headlight high beams.

Recent improvements have produced white LEDs in which the phosphor-binder mixture is limited to a small region directly on the die surface, largely co-extensive with the die. An example is shown in FIG. 2B. Note that this method of applying the phosphor is much easier when the die is a "flip chip" with all its contacts on the bottom surface, and therefore no bond wire on top. However, applying the phospor directly to the surface of the die has several disadvantages. The phosphor/binder mixture is subjected to the high temperatures of the die, which produces large amounts of heat and is typically the highest-temperature point in the package. The resulting high temperature causes color shifts due to the temperature sensitivity of the phosphor light emission. High temperatures also subject both binder and phosphor to temperature related degradation, which decreases light output over time. White LEDs accoding to FIG. 2 are also subject to color non-uniformity, as light emitted directly by the LED has a different spatial or angular pattern from light emitted by the phosphor.

DESCRIPTION OF THE INVENTION

Figure 3:
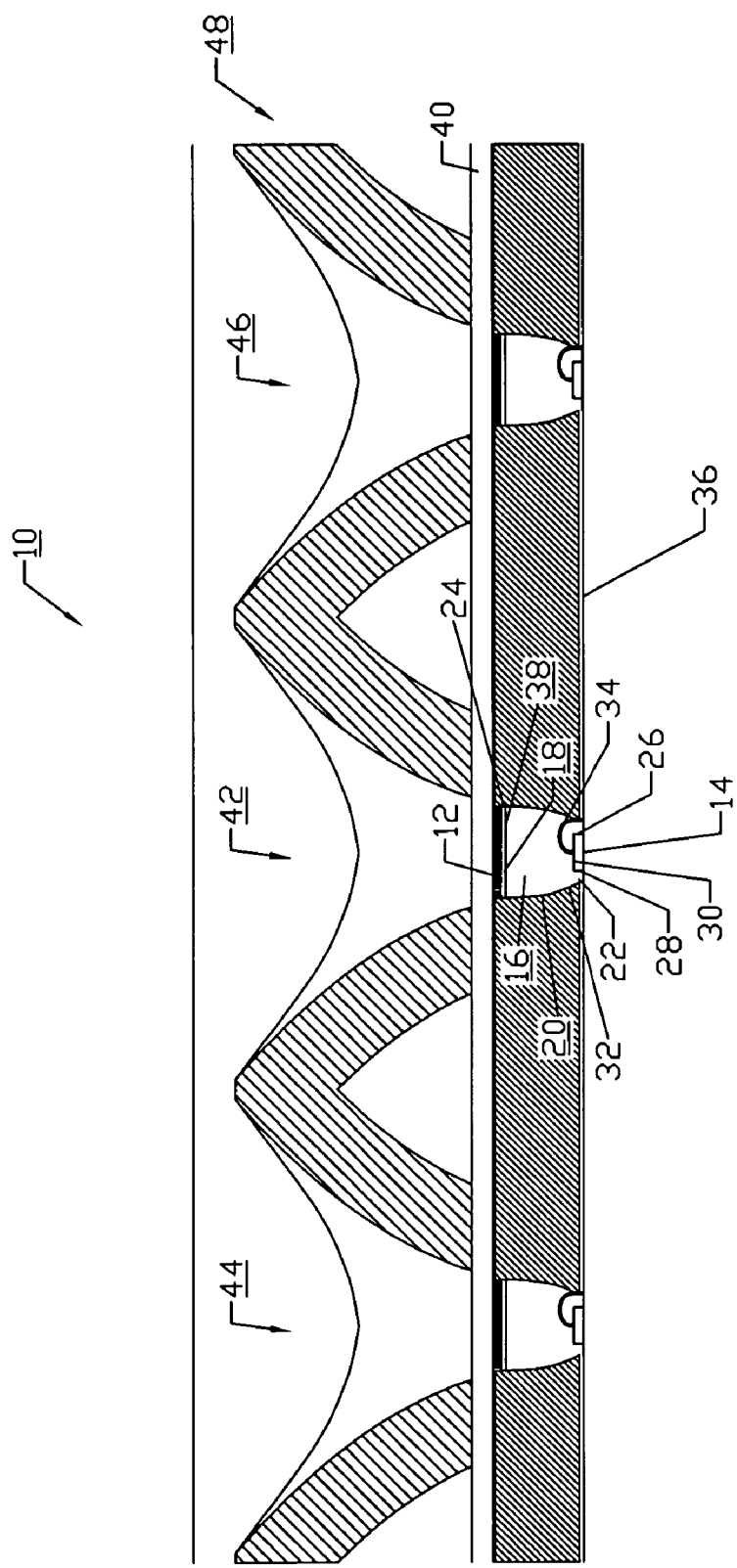
FIG. 3 shows an array of LED light sources constructed with the non-imaging coupler constructed as a single layer.

FIG. 3 shows one embodiment of the current invention, shown generally at 10. The phosphor is deposited in a layer 12 separated from the die 14 by a significant thickness of clear encapsulant 16. The phosphor 12 is immersed in a medium 18 having an optical index $n_2$ lower than that of the encapsulant 16. In one embodiment of FIG. 3 the medium 18 is air. The phosphor 12 spatial area is larger than the die 14, but by virtue of this lower index the phosphor layer 12 has an optical etendue comparable to that of the die 14 itself. A non-imaging optical coupler 20 collects the majority of the light from the die 14 and redirects it to the phosphor 12 while maintaining the etendue comparable to the die 14.

The non-imaging optical coupler 20 can have a variety of forms as described in many known publications and U.S. patents. The shape of the coupler 20 should redirect most of the light from the die 14 from very large angles inside the encapsulant 16 to angles smaller than the critical angle $\arcsin[n_2/n_{encapsulant}]$, so that the light is not trapped in the encapsulant 16 by total internal reflection (TIR). In the embodiment of FIG. 3 the non-imaging optical coupler 20 has the cross-section of a compound parabolic concentrator (CPC). In three dimensions the coupler 20 can have cylindrical or rectangular symmetry (CPC or "crossed CPC"). The input aperture 22 of the coupler 20 has diameter and angle $D_{in}$ and $\pm\theta_{in}$, where $D_{in}$ is equal or somewhat larger than the diameter of the die 14 and $\theta_{in}$ is 60–90°, corresponding to the die 14 output angular distribution measured inside the encapsulant 16. The output aperture 24 of the coupler 20 has diameter $D_{out}$ comparable to, $$\frac{n_{encapsulant}}{n^2} \frac{D_{in}}{\sin\theta_2}$$

where $\theta_2$ is typically 70–90°. Thus the output etendue $n_2^2 \pi^2 (D_{out}^2/4) \sin^2\theta_2$ is comparable to the etendue of the die 14 itself.

The shape of the non-imaging coupler 20 need not be a CPC. Because the die 14 emits light from the sides 26 and 28 as well as the top 30, it may be preferred to adjust the shape 20 to optimally collect this side emission along with the top emission. In some embodiments the bottom portion 31 of the coupler 20 will approach the sides 26 and 28 of the die 14 very closely. In this case it may be preferred to cut out a small region of one sidewall 32 to leave room for the bond wire 34 shown in the FIG. 3, with the coupler 20 preferably placed on the substrate 36 after the die 14 has been attached and wire-bonded.

Phosphor powder 12 can be applied to a solid surface 38 or 40 but be substantially immersed in air using various application methods. For example, the phosphor can be dispersed in a binder, spread on the surface; and then the binder can be burned off, as is common in manufacturing flouorescent lamps. The phosphor can also be dispersed in a solvent, spread on the surface, and the solvent can be evaporated off. By these methods the phosphor can be applied to a solid surface, such as the surface 38 of the encapsulant 16. In the embodiment of FIG. 3 the phosphor 12 is supported by a glass layer 40, which facilitates application and provides additional sealing to the die region.

In the embodiment of FIG. 3 the phosphor 12 region is further coupled to a non-imaging collimator secondary optic 42. This secondary optic 42 was described in detail in our copending patent application "Compact Non-Imaging Light System" filed May 5, 2004.

The embodiment of FIG. 3 is simple, compact, manufacturable, efficient, and well-adapted for applications needing collimated beams. With the die 14 coupled to a low thermal resistance substrate 36, the die 14 can be driven very hard to produce high lumens/mm², and the optics 20 and 42 will preserve the beam density. The simplicity of the design also makes it easy to tailor to different output distributions, and to adjust the design as LED efficiency continues to improve.

Figure 1:
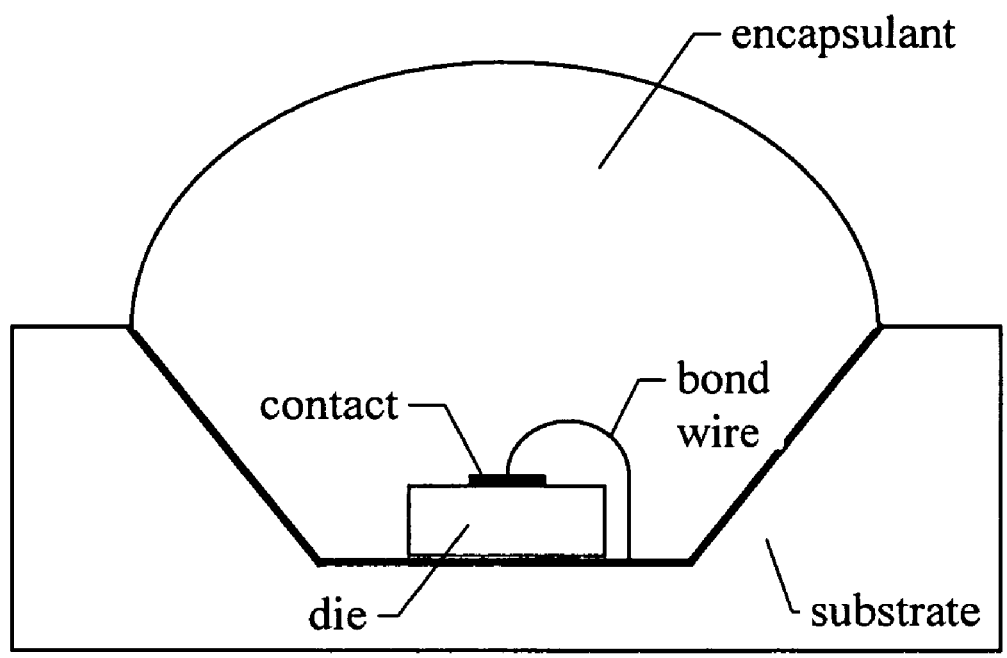
FIG. 1 shows a prior art typical single-color LED lamp package without a phosphor layer.
Figure 2A:
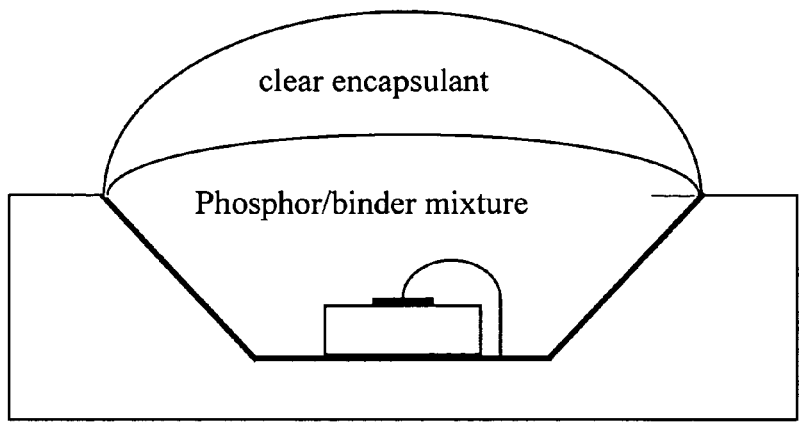
FIG. 2A shows one example of a prior art white LED package including a phosphor layer and FIG. 2B shows another form of prior art with phosphor layer.
Figure 2B:
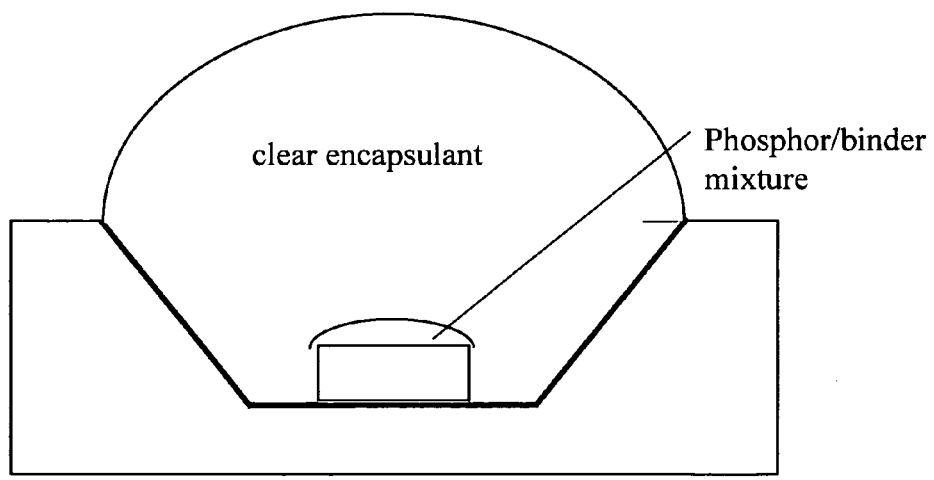

Some important advantages of this device and approach include:

1) The phosphor 12 is thermally isolated from the die 14, so temperature stability of the phosphor 14 is less of an issue than in conventional packages, allowing a greater range of phosphors to be used.
2) The glass 42 seals the system, protecting the phosphor 12 from moisture and other contaminants.
3) Unlike the approach shown in FIG. 2B, this approach can be used equally well when there is a bond wire 34 on top of the die 14 (not just for flip chips as in 2B).
4) The phosphor 12 makes a nice, uniform, Lambertian source for this second non-imaging array 42, hiding the bond wire 34 or the contact electrode patterns typically found on the surfaces 30 of the die 14.
5) For headlights and similar systems with complex output distributions, individual elements 42, 44, and 46 of the molded non-imaging array 48 can be tilted at different axes.

Figure 4:
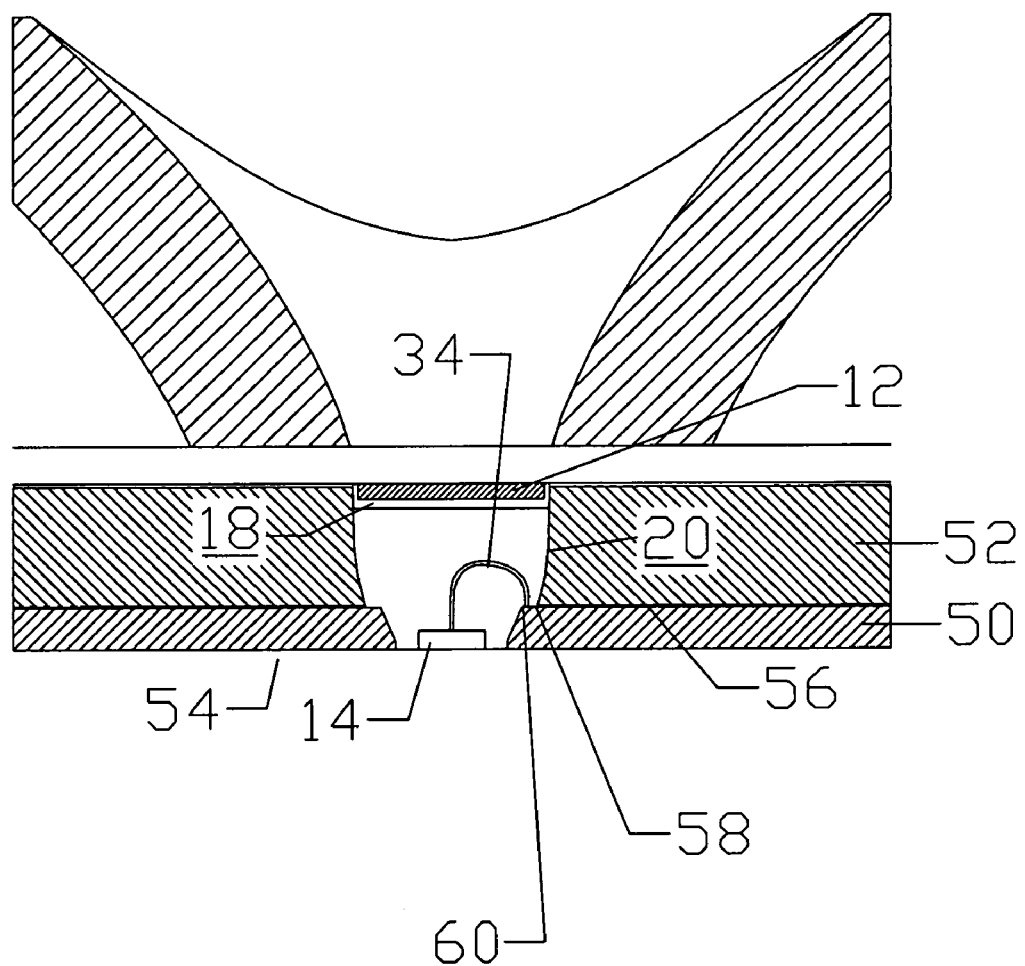
FIG. 4 shows a single LED light source with the non-imaging light coupler constructed in two layers, leaving a ledge between layers to allow room for attaching a bond wire.

FIG. 4 shows another embodiment in which the non-imaging coupler 20 is made in two layers 50 and 52. The bottom layer 50 can be part of the circuit board 54. The die 14 is placed on the circuit board 54 as shown in FIG. 4 and wire-bonded to the top 56 of the first layer 50, within approximately 0.2 mm of the edge 60 of the ledge 58. Then a molded second layer 52 is added. The advantage is the wire bond 34 can be placed at a point in the assembly sequence where there is plenty of room for access by most common types wire-bonding equipment. The step 58 can be integrated into the non-imaging design 20, so that optical performance shows very little degradation.

While preferred embodiments of the invention have been shown and described, it will be clear to those skilled in the art that various changes and modifications can be made without departing from the invention in its broader aspects.

What is claimed is:

1. A light source comprising:
   a semiconductor light source surrounded by an encapsulating first medium having a first optical index of refraction $n_{encapsulant}$;
   a layer of phosphor surrounded by a second medium having a second optical index of refraction $n_2$ less than said first index of refraction of said encapsulating first medium; and
   a light coupler redirecting the majority of light from said semiconductor light source to an area of said layer of phosphor approximately equal to the area of said semiconductor light source multiplied by $(n_{encapsulant}/n2)^2$.

2. The device of claim 1 where said light coupler is a non-imaging reflector.

3. The device of claim 2 where said non-imaging reflector is a compound parabolic concentrator.

4. The device of claim 3 where said compound parabolic concentrator has a light output angle approximately equal to arcsine($n_2/n_{encapsulant}$) for light inside said encapsulating first medium.

5. The device of claim 2 where said light coupler comprises a first portion nearer to said semiconductor light source and a second portion farther from said semiconductor light source than said first portion, said first and second portions separated by a ledge region about parallel to the top surface of said semiconductor light source and situated at a level intermediate between the bottom surface of said semiconductor light source and the output aperture of said light coupler.

6. The device of claim 5 where said ledge region is about 0.2 mm or more in extent.

7. The device of claim 5 including a bond wire connecting said semiconductor light source to said ledge region.

8. The device of claim 1 where said first optical index of refraction is between 1.4 and 1.7 and said second optical index of refraction is less than 1.2.

9. The device of claim 8 where said area of said phosphor layer is less than three times the area of said semiconductor light source.

10. The device of claim 1 where said second medium is air.

11. A light source comprising,
a semiconductor light source surrounded by an encapsulating first medium having a first optical index of refraction $n_{encapsulant}$;
a layer of phosphor surrounded by a second medium having a second optical index of refraction $n_2$ less than said first index of refraction of said encapsulating first medium; and
a light coupler having a structure which substantially conserves etendue for redirecting the majority of light from said semiconductor light source to said layer of phosphor and said coupler having an output light angle inside said first medium arcsine ($n_2/n_{encapsulant}$).

12. The device of claim 11 where said non-imaging coupler is a compound parabolic concentrator.

13. The device of claim 11 where said coupler has input diameter $D_{in}$, an output diameter $D_{out}$, and an output angle in said second medium $\theta_2$, such that $D_{out}$ is about equal to $$\frac{n_{encapsulant}}{n^2} \frac{D_{in}}{\sin\theta_2}$$

14. The device of claim 13 where said coupler comprises a first portion nearer to said semiconductor light source and a second portion farther from said semiconductor light source than said first portion, said first and second portions separated by a ledge region, where said first portion blocks light ray paths from said semiconductor light source from reaching said ledge region.

* * * * *

UNITED STATES PATENT AND TRADEMARK OFFICE
CERTIFICATE OF CORRECTION

PATENT NO. : 7,108,386 B2 Page 1 of 1
APPLICATION NO. : 10/844153
DATED : September 19, 2006
INVENTOR(S) : Benjamin A. Jacobson and Robert D. Gengelbach It is certified that error appears in the above-identified patent and that said Letters Patent is hereby corrected as shown below:

Col. 4, line 63, delete " $\left(n_{encapsulant/n2}\right)^2$ " and insert -- $\left(\dfrac{n_{encapsulant}}{n_2}\right)^2$ --;

Col. 6, line 17, delete " $\dfrac{n_{encapsulant}}{n^2} \dfrac{D_{in}}{sin\theta_2}$ " and insert -- $\dfrac{n_{encapsulant}}{n_2} \dfrac{D_{in}}{sin\theta_2}$ --.

Signed and Sealed this

Twenty-sixth Day of December, 2006

JON W. DUDAS
*Director of the United States Patent and Trademark Office*